(12) United States Patent
Ozaki et al.

(10) Patent No.: US 9,655,240 B2
(45) Date of Patent: May 16, 2017

(54) SUBSTRATE

(71) Applicant: KABUSHIKI KAISHA TOYOTA JIDOSHOKKI, Aichi-ken (JP)

(72) Inventors: Kiminori Ozaki, Kariya (JP); Yasuhiro Koike, Kariya (JP); Hiroaki Asano, Kariya (JP); Hitoshi Shimadu, Kariya (JP); Shigeki Kawaguchi, Tokai (JP); Tomoaki Asai, Nagoya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days.

(21) Appl. No.: 14/437,059

(22) PCT Filed: Oct. 23, 2013

(86) PCT No.: PCT/JP2013/078704
§ 371 (c)(1),
(2) Date: Apr. 20, 2015

(87) PCT Pub. No.: WO2014/069305
PCT Pub. Date: May 8, 2014

(65) Prior Publication Data
US 2015/0289371 A1    Oct. 8, 2015

(30) Foreign Application Priority Data

Nov. 1, 2012 (JP) .................. 2012-241898

(51) Int. Cl.
| | |
|---|---|
| H05K 1/11 | (2006.01) |
| H05K 1/18 | (2006.01) |
| H05K 3/40 | (2006.01) |
| H01L 23/00 | (2006.01) |
| H05K 3/34 | (2006.01) |

(52) U.S. Cl.
CPC .............. *H05K 1/111* (2013.01); *H01L 24/27* (2013.01); *H01L 24/83* (2013.01); *H05K 1/181* (2013.01);
(Continued)

(58) Field of Classification Search
CPC ...... H05K 1/111; H05K 3/4007; H05K 1/181; H05K 3/34; H05K 1/18; H05K 2201/0373;
(Continued)

(56) References Cited

U.S. PATENT DOCUMENTS 6,246,587 B1 * 6/2001 Chen .................. H01R 4/04
174/260
6,448,507 B1 * 9/2002 Fontecha ............ H01L 24/32
174/260
(Continued)

FOREIGN PATENT DOCUMENTS

EP    1986478 A2    10/2008
JP    6-112634    4/1994
(Continued)

OTHER PUBLICATIONS

English language translation of International Preliminary Report on Patentability and Written Opinion of the International Searching Authority in PCT/JP2013/078704, dated May 5, 2015.
(Continued)

*Primary Examiner* — Ishwarbhai B Patel
(74) *Attorney, Agent, or Firm* — Greenblum & Bernstein P.L.C.

(57) ABSTRACT

A substrate includes an insulating substrate, a metal layer formed on one surface of the insulating substrate, and an electronic component soldered to the surface of the metal layer. The metal layer is formed of a metal plate. The surface of the metal layer has a soldering area, and a groove portion positioned on the outer periphery of the soldering area.

4 Claims, 2 Drawing Sheets

(52) U.S. Cl.
CPC ............ H05K 3/4007 (2013.01); *H01L 24/29* (2013.01); *H01L 2224/26175* (2013.01); *H01L 2224/2732* (2013.01); *H01L 2224/291* (2013.01); *H01L 2224/29013* (2013.01); *H01L 2224/29017* (2013.01); *H01L 2224/29018* (2013.01); *H01L 2224/32227* (2013.01); *H01L 2224/83192* (2013.01); *H01L 2224/83385* (2013.01); *H01L 2224/83815* (2013.01); *H05K 3/3442* (2013.01); *H05K 2201/0373* (2013.01); *H05K 2201/09427* (2013.01); *H05K 2201/09745* (2013.01); *H05K 2201/09827* (2013.01); *H05K 2201/2072* (2013.01); *H05K 2203/0108* (2013.01); *H05K 2203/0465* (2013.01); *Y02P 70/611* (2015.11)

(58) Field of Classification Search
CPC .......... H05K 2201/09427; H05K 2201/09827; H05K 2203/0108; H05K 2203/0465; H05K 1/023; H05K 1/0231; H05K 3/30; H05K 3/303; H05K 3/3431; H05K 3/3442; H01L 24/27; H01L 24/83; H01L 2224/29017; H01L 24/29; Y02P 70/611
USPC ................. 174/250–268; 361/760, 763–768, 361/773–774, 777, 792–795; 228/180.1, 228/180.21, 180.22
See application file for complete search history.

(56) References Cited

U.S. PATENT DOCUMENTS

| 6,787,700 | B2* | 9/2004 | Nagao | .................... H01R 4/028 174/541 |
|---|---|---|---|---|
| 8,138,426 | B2* | 3/2012 | Matsuno | ................. H01L 24/16 174/260 |
| 8,686,823 | B2 | 4/2014 | Asano et al. | |
| 2003/0068537 | A1 | 4/2003 | Tsukaguchi et al. | |
| 2003/0073349 | A1 | 4/2003 | Nagao et al. | |
| 2012/0119868 | A1* | 5/2012 | Shimadu | ............. H01L 23/3677 336/200 |

FOREIGN PATENT DOCUMENTS

| JP | 7-254775 | 10/1995 |
| JP | 7-263849 | 10/1995 |
| JP | 2003-110205 | 4/2003 |
| JP | 2004-006454 A | 1/2004 |
| JP | 2004-140226 | 5/2004 |
| JP | 2006-114587 | 4/2006 |
| JP | 2011-151368 | 8/2011 |

OTHER PUBLICATIONS

U.S. Appl. No. 14/438,968 to Kiminori Ozaki et al., filed Apr. 28, 2015.
International Search report from PCT/JP2013/078704, mail date is Dec. 10, 2013.
Decision to grant patent in Japanese application JP 2012-241898, with English language translation, dated Mar. 4, 2014.
Office Action in Japanese Application JP 2012-241898, with English language translation, dated Dec. 10, 2013.
Extended European Search Report in EP13851622.4, dated Jun. 9, 2016.

* cited by examiner

SUBSTRATE

TECHNICAL FIELD

The technology of the present disclosure relates to a substrate, which includes an insulating substrate, a metal layer formed on a surface of the insulating substrate, and an electronic component mounted on the surface of the metal layer by soldering, and to a method for producing the substrate.

BACKGROUND ART

When an electronic component is mounted by soldering on the surface of a metal layer formed on a surface of an insulating substrate, excessive spreading of solder on the surface of the metal layer needs to be limited. The reliability of soldering is increased by limiting spreading of solder and appropriately confining the solder within a predetermined area. For example, a known technique limits spreading of solder out of a soldering region by forming the entire soldering region as a solder pool that is lower than the other portion (see Patent Document 1).

PRIOR ART DOCUMENT

Patent Document

Patent Document 1: Japanese Laid-Open Patent Publication No. 2011-151368

SUMMARY OF THE INVENTION

Problems that the Invention is to Solve

In a typical method for mounting an electronic component on the surface of a metal layer by soldering, a mask, which has a predetermined opening, is placed over the surface of the metal layer, and solder paste is applied to the metal layer. Then, the mask is removed and an electronic component is mounted on the applied solder. However, when such a mounting method is used for a metal layer in which the entire soldering region is a solder pool, the solder may be peeled off from the metal layer together with the mask when the mask is removed.

It is an object of the present disclosure to provide a substrate that facilitates application of solder to the surface of a metal layer using a mask and limits spreading of solder, and a method for producing the substrate.

Means for Solving the Problems

To achieve the foregoing objective, a substrate is provided that includes an insulating substrate, a metal layer formed on a surface of the insulating substrate, and an electronic component soldered to a surface of the metal layer. The metal layer is made of a metal plate. The surface of the metal layer includes a soldering region and a groove portion that is located on a periphery of the soldering region.

To achieve the foregoing objective, a method for producing a substrate is provided. The substrate includes an insulating substrate, a metal layer, which is formed on a surface of the insulating substrate and made of a metal plate, and an electronic component, which is mounted on a surface of the metal layer by soldering. The method includes: applying solder to an application portion, which is defined on the surface of the metal layer, using a mask; mounting the electronic component on the solder; and using, as the metal layer, a metal layer that includes a groove portion on an outer side of the application portion.

MODES FOR CARRYING OUT THE INVENTION

A substrate according to one embodiment will now be described with reference to the drawings.

Figure 1:
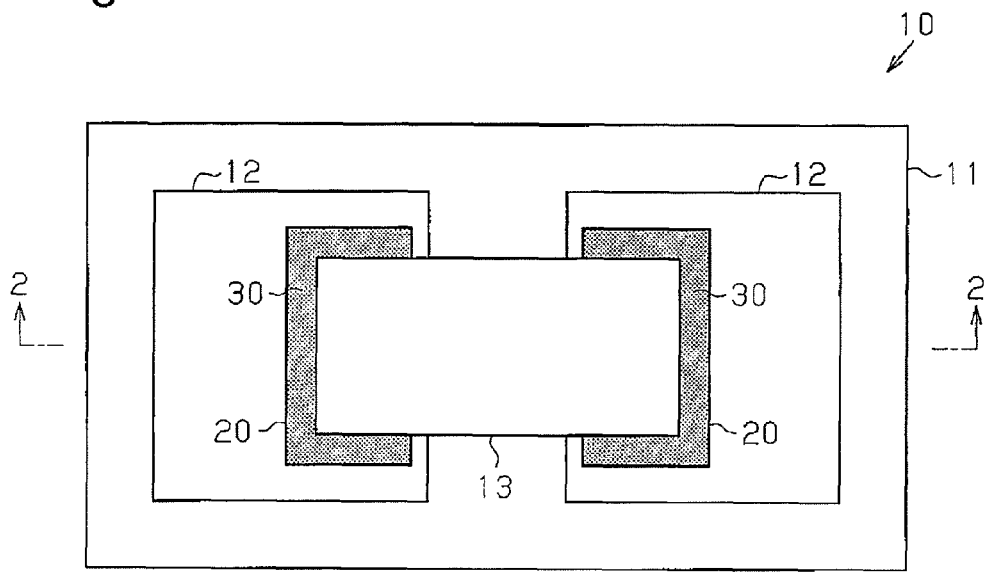
FIG. 1 is a top view showing a substrate of an embodiment.
Figure 2:
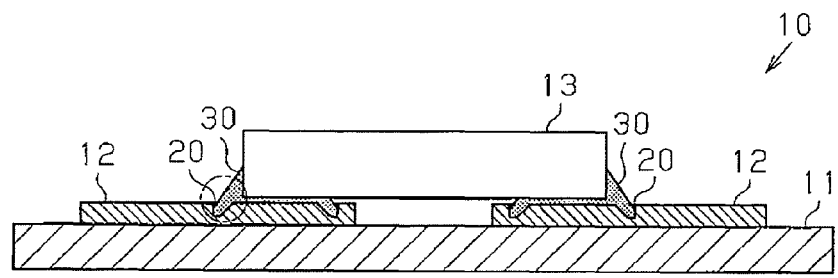
FIG. 2 is a cross-sectional view taken along line 2-2 in FIG. 1.

As shown in FIGS. 1 and 2, a substrate 10 includes an insulating substrate 11, two metal layers 12, which are separated by a predetermine distance and adhered to the upper surface of the insulating substrate 11, and an electronic component 13, which is mounted to bridge the upper surfaces of the two metal layers 12.

Each metal layer 12 is made of a metal plate, which has a predetermined pattern, and formed by cutting out (stamping) the predetermine pattern from a metal plate material. The metal plate that forms the metal layer 12 may be a copper plate or a metal plate formed from a conductive metal material, such as aluminum, that includes a plated soldering portion. The thickness of the metal plate is preferably 0.4 to 2.0 mm, inclusive, more preferably 0.5 to 1.0 mm, inclusive. The present embodiment uses a copper plate that has a thickness of 0.5 mm.

Figure 3:
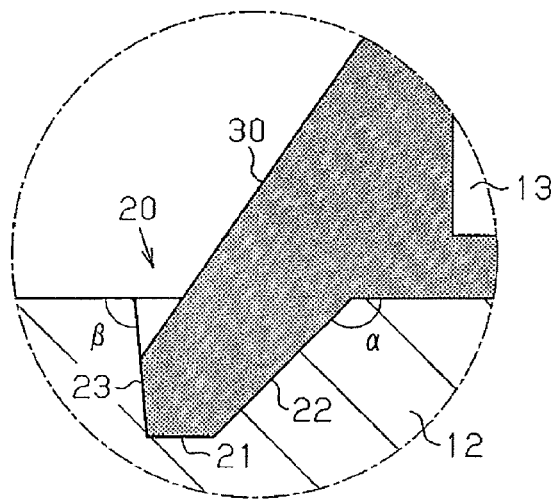
FIG. 3 is an enlarged view of a groove portion.

As shown in FIGS. 1 and 2, a groove portion 20 is formed in the upper surface of each metal layer 12. The groove portion 20 has the shape of a rectangular frame as viewed from above. The groove portion 20 has a looped shape, that is, an endless shape. As shown in FIG. 3, the groove portion 20 includes a bottom surface 21, a first side surface 22, which is the inner side surface, and a second side surface 23, which is the outer side surface. The bottom surface 21 is a flat surface extending parallel to the upper surface of the metal layer 12. The first side surface 22 and the second side surface 23 are oblique surfaces connecting the bottom surface 21 and the upper surface of the metal layer 12. The groove portion 20 is formed, when stamping the metal layer 12, by pressing the upper surface of the metal plate with a shaping die, which has a projection corresponding to the groove portion 20, to dent a portion of the upper surface of the metal plate, for example.

As shown in FIG. 3, each of the angle $\alpha$ formed by the upper surface of the metal layer 12 and the first side surface 22 and the angle $\beta$ formed by the upper surface of the metal layer 12 and the second side surface 23 is from 95 to 150 degrees, inclusive. In the present embodiment, the angle $\alpha$ is 135 degrees and greater than the angle $\beta$, which is 95 degrees. In addition, in the present embodiment, the depth of the groove portion 20 is 0.12 mm.

As shown in FIGS. 1 and 2, solder 30 is applied to the region in the upper surface of each metal layer 12 that is surrounded by the groove portion 20. In other words, the groove portion 20 extends along the periphery of the solder 30 that is applied to the metal layer 12, that is, the periphery of the region in the upper surface of the metal layer 12 to which solder is applied (soldering region), to surround the soldering region. The electronic component 13 is mounted on the upper surface of the metal layer 12 through the solder 30.

A method for mounting the electronic component 13 on the upper surface of the metal layers 12 through soldering, and the operation of the substrate 10 of the present embodiment will now be described.

Figure 4:
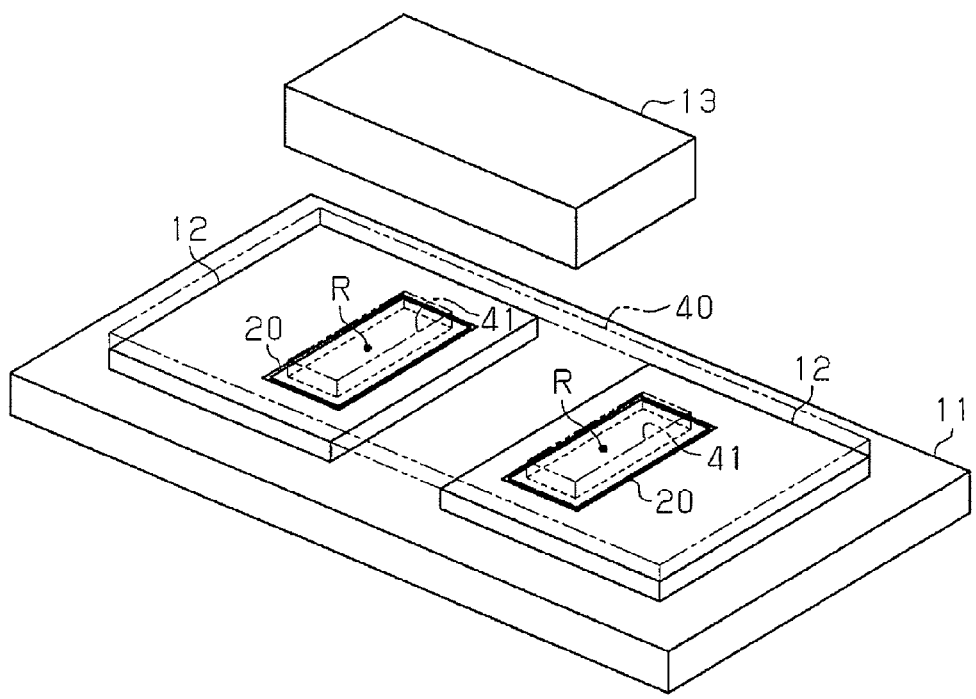
FIG. 4 is a diagram showing a mounting method of an electronic component.

As shown in FIG. 4, an application portion R to which solder is applied (the region in the broken lines in FIG. 4) is defined in the upper surface of each metal layer 12, which is adhered to the upper surface of the insulating substrate 11. The groove portion 20 is endless and surrounds the application portion R. In addition, the groove portion 20 extends along the edge of the application portion R and is spaced apart from the edge of the application portion R.

A mask 40 is placed over the upper surfaces of the metal layers 12 (the mask 40 is indicated by the long dashed short dashed lines in FIG. 4). The mask 40 includes openings 41, each of which has a shape corresponding to the application portion R. The mask 40 covers the groove portions 20, which are formed on the outer side of the application portions R. Solder paste is applied to the upper surfaces of the metal layers 12 through the openings 41 of the mask 40 using a squeegee or the like, and the mask 40 is removed from the metal layers 12. Accordingly, solder is applied to the upper surfaces of the application portions R of the metal layers 12.

In the present embodiment, each application portion R to which solder is applied does not include the groove portion 20. This allows for a sufficient adhesion surface between the solder and the upper surface of the flat application portion R, enabling adequate adhesion of solder to the metal layer 12. Thus, the solder resists peeling from the metal layer 12 together with the mask 40.

Then, the electronic component 13 is placed on the solder applied to the application portions R of the metal layers 12. The substrate 10 is heated to melt the solder and then cooled to harden the solder. Accordingly, the electronic component 13 is mounted on the upper surfaces of the metal layers 12 by soldering.

When melting, the solder spreads out of each application portion R, but the groove portion 20 around the application portion R limits spreading of the solder beyond the groove portion 20. Although flux, which spreads earlier than the solder, tends to spread beyond the groove portion 20 on the metal layer 12, spreading of the solder is likely to be limited by the groove portion 20 so that the solder is confined within the groove portion 20. In addition, in the upper surface of each metal layer 12, the solder spreads from the application portion R into the region between the application portion R and the groove portion 20, causing the entire region surrounded by the groove portion 20 to become a soldering region. The groove portion 20 is located on the periphery of the soldering region.

The present embodiment achieves the following advantages.

(1) The substrate 10 includes the insulating substrate 11, the metal layers 12, which are formed on the upper surface of the insulating substrate 11, and the electronic component 13, which is mounted on the upper surfaces of the metal layers 12 by soldering. Each metal layer 12 is made of a metal plate. The groove portion 20 is located on the periphery of the soldering region in the upper surface of each metal layer 12.

In the above structure, each groove portion 20 is located on the periphery of the soldering region, instead of inside the soldering region. This allows for a sufficient adhesion surface between the solder and the soldering region (application portion R) of the metal layer 12 when the solder is applied to the surface of the metal layer 12 using a mask, enabling adequate adhesion between the metal layer 12 and the solder. Thus, the applied solder resists peeling when the mask is removed, which facilitates application of solder.

Furthermore, when the substrate 10 is heated to melt the solder, spreading of the solder beyond the groove portion 20 is limited, and the solder is confined within the groove portion 20. This allows for a sufficient amount of solder provided between the metal layer 12 and the electronic component 13, improving the reliability of soldering.

(2) Each groove portion 20 is endless and surrounds the associated soldering region. In other words, the groove portion 20 extends continuously around the entire soldering region. Such a structure limits spreading of the solder 30 in all directions from the soldering region.

(3) Each groove portion 20 includes the flat bottom surface 21, the first side surface 22, which is the inner side surface (closer to the soldering region), and the second side surface 23, which is the outer side surface (farther from the soldering region).

When the groove portion 20 is formed by pressing the metal layer 12 with a shaping die that includes a projection corresponding to the groove portion 20, repeated use of the shaping die may cause damage, such as blunting or chipping, to the distal end of the projection of the shaping die. When the groove portion 20 includes the flat bottom surface 21 as described above, the distal end of the projection of the shaping die is also flat. This limits stress applied to the distal end of the projection of the shaping die when forming the groove portion 20, limiting damage to the distal end of the projection.

(4) In each groove portion 20, the angle $\alpha$, which is formed by the surface of the metal layer 12 and the first side surface 22, is from 95 to 150 degrees, inclusive, and the angle $\beta$, which is formed by the surface of the metal layer 12 and the second side surface 23, is from 95 to 150 degrees, inclusive.

The above structure limits spreading of the solder 30 beyond the groove portion 20 in a suitable manner. In addition, setting the angles as described above limits engagement between the metal layer 12 and the shaping die when the groove portion 20 is formed by pressing the shaping die to the metal layer 12. This facilitates removing of the shaping die out of the metal layer 12.

(5) The angle $\alpha$, which is formed by the surface of the metal layer 12 and the first side surface 22, is greater than the angle $\beta$, which is formed by the surface of the metal layer 12 and the second side surface 23. In such a structure, the second side surface 23, which is on the outer side, is inclined to be more vertical. This further limits spreading of the solder 30 beyond the groove portion 20 in a suitable manner.

The above illustrated embodiment may be modified as follows.

The groove portion 20 does not have to be endless, or continuous, and may have ends, or be discontinuous. For example, depending on the pattern of the metal layer 12, the upper surface of the metal layer 12 may include a section that permits spreading of solder to some extent and a section that does not permit spreading. In this case, the groove portion 20 may be located only between the soldering region (application portion R) and the section that does not permit spreading of solder.

There is no limitation to the cross-sectional shape of the groove portion 20. For example, the bottom surface 21 may be curved, which still achieves advantage (3) described above. Alternatively, the groove portion 20 does not have to include the bottom surface 21 and may have a V-shaped cross section.

The angle α, which is formed by the surface of the metal layer 12 and the first side surface 22, may be equal to the angle β, which is formed by the surface of the metal layer 12 and the second side surface 23. Alternatively, the angle α may be less than the angle β.

In the present embodiment, the electronic component 13 is mounted to bridge the two metal layers 12 that are spaced apart. However, the electronic component 13 may be located on the upper surface of only one of the metal layers 12.

The substrate 10 may be a double-sided substrate in which an additional metal layer is adhered to the lower surface of the insulating substrate 11, or may be a multi-layered substrate further including an inner layer that has a predetermined pattern.

The invention claimed is:

1. A substrate comprising:
an insulating substrate;
a metal layer formed on a surface of the insulating substrate; and
an electronic component soldered to a surface of the metal layer, wherein:
the metal layer is made of a metal plate,
the surface of the metal layer includes a soldering region and a groove portion that is located on a periphery of the soldering region,
the groove portion includes a bottom surface, which is formed of the metal layer, a first side surface, which is located on one side with respect to the soldering region on an inner side of the groove portion, and a second side surface, which is located at a side opposite to the one side on an outer side of the groove portion, the first side surface and the second side surface forming an acute angle, and
a solder spreads from an area between the metal layer and the electronic component and flows into the groove portion to form a soldering fillet spreading from the electronic component to the second side surface of the groove portion, wherein
the metal layer is one of two metal layers that are spaced apart from each other,
the electronic component is arranged to bridge the two metal layers, and
the groove portion is located on an outermost periphery of the soldering region that is directly below the electronic component so that the soldering fillet spreads to the second side surface of the groove portion at the portion directly below the electronic component,
wherein the groove portion is endless and surrounds the soldering region.

2. The substrate according to claim 1, wherein
the surface of the metal layer and the first side surface form an angle from 95 to 150 degrees, inclusive, and
the surface of the metal layer and the second side surface form an angle from 95 to 150 degrees, inclusive.

3. The substrate according to claim 2, wherein the angle formed by the surface of the metal layer and the first side surface is greater than the angle formed by the surface of the metal layer and the second side surface.

4. The substrate according to claim 1, wherein the bottom surface of the groove portion is lower than the portion of the soldering region other than the groove portion.

* * * * *